(12) United States Patent
Herrmann (10) Patent No.: US 8,476,667 B2
(45) Date of Patent: Jul. 2, 2013

(54) OPTOELECTRONIC COMPONENT

(75) Inventor: Siegfried Herrmann, Neukirchen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 108 days.

(21) Appl. No.: 12/809,682

(22) PCT Filed: Dec. 4, 2008

(86) PCT No.: PCT/DE2008/002036
§ 371 (c)(1), (2), (4) Date: Aug. 23, 2010

(87) PCT Pub. No.: WO2009/079978
PCT Pub. Date: Jul. 2, 2009

(65) Prior Publication Data
US 2010/0308362 A1 Dec. 9, 2010

(30) Foreign Application Priority Data

Dec. 20, 2007 (DE) .......... 10 2007 061 480
Feb. 29, 2008 (DE) .......... 10 2008 011 809

(51) Int. Cl.
*H01L 33/38* (2010.01)
*H01L 33/64* (2010.01)

(52) U.S. Cl.
USPC .......... 257/99; 257/E33.065; 257/E33.075; 438/26; 313/505

(58) Field of Classification Search
USPC . 257/99, E33.065, E33.075; 438/26; 313/505
See application file for complete search history.

(56) References Cited

U.S. PATENT DOCUMENTS

| | | | |
|---|---|---|---|
| 3,991,339 A * | 11/1976 | Lockwood et al. | 313/499 |
| 6,559,075 B1 | 5/2003 | Kelly et al. | |
| 7,199,470 B2 | 4/2007 | Bogner et al. | |
| 7,678,591 B2 | 3/2010 | Illek | |
| 2003/0085654 A1* | 5/2003 | Hayashi | 313/506 |
| 2003/0218176 A1* | 11/2003 | Zhao et al. | 257/81 |
| 2004/0012964 A1* | 1/2004 | Makuta | 362/294 |
| 2004/0061123 A1* | 4/2004 | Shelton et al. | 257/99 |
| 2004/0129946 A1* | 7/2004 | Nagai et al. | 257/98 |
| 2006/0043407 A1* | 3/2006 | Okazaki | 257/100 |
| 2006/0097270 A1* | 5/2006 | Yuri | 257/88 |
| 2006/0186805 A1* | 8/2006 | Kim et al. | 313/506 |
| 2006/0273335 A1 | 12/2006 | Asahara et al. | |
| 2007/0131958 A1* | 6/2007 | Hsu et al. | 257/99 |
| 2007/0267967 A1* | 11/2007 | Naum | 313/503 |
| 2008/0101071 A1* | 5/2008 | Imai et al. | 362/294 |
| 2009/0278157 A1 | 11/2009 | Weidner | |
| 2010/0038668 A1 | 2/2010 | Noma | |

FOREIGN PATENT DOCUMENTS

| | | |
|---|---|---|
| DE | 100 40 448 | 3/2002 |
| DE | 102 34 978 | 2/2004 |
| DE | 10 2007 004 301 | 2/2008 |

(Continued)

*Primary Examiner* — Steven J Fulk
(74) *Attorney, Agent, or Firm* — Cozen O'Connor (57) ABSTRACT

An optoelectronic component (10) comprising at least one metal body (15) and a layer sequence (17), which is applied on a base body (11) and which is embodied to emit an electromagnetic radiation and to which an insulation (12) is applied on at least one side area, wherein the at least one metal body (15) is applied to at least one region of the insulation (12) and is embodied in such a way that it is in thermally conductive contact with the base body (11).

16 Claims, 4 Drawing Sheets

FOREIGN PATENT DOCUMENTS

| | | |
|---|---|---|
| EP | 1 391 936 | 2/2004 |
| EP | 1 635 403 | 3/2006 |
| EP | 1 646 092 | 4/2006 |
| JP | 10-294493 | 11/1998 |
| JP | 2006-173433 | 6/2006 |
| JP | 2006-278766 | 10/2006 |
| JP | 2007-026916 | 2/2007 |
| JP | 2007-529879 | 10/2007 |
| TW | 200723561 | 6/2007 |
| WO | WO 98/14986 | 4/1998 |
| WO | WO 2006/006555 | 1/2006 |
| WO | WO 2007/025521 | 3/2007 |
| WO | WO 2008/093880 | 8/2008 |
| WO | WO 2009/003442 | 1/2009 |

* cited by examiner

OPTOELECTRONIC COMPONENT

This is a U.S. national stage of PCT application No. PCT/DE2008/002036, filed on Dec. 4, 2008, and claims priority on German Patent Application No. 10 2007 061 480.4, filed Dec. 20, 2007, and on German Patent Application No. 10 2008 011 809.5, filed on Feb. 29, 2008, the contents of both of which are hereby incorporated by reference.

BACKGROUND OF THE INVENTION

The published patent application DE 100 40 448 A1 describes a semiconductor chip and a method for producing semiconductor chips using thin-film technology. A layer assemblage composed of an active layer sequence and a base layer is arranged on a substrate. Furthermore, a reinforcement layer and an auxiliary carrier layer are added to the layer assemblage, said reinforcement layer and auxiliary carrier layer being applied to the base layer galvanically before the substrate is stripped away. On the side of the stripped-away substrate, a film is laminated on for the purpose of handling the semiconductor chips formed from the layer assemblage.

Furthermore, the published patent application DE 102 34 978 A1 discloses a surface-mountable semiconductor component comprising a semiconductor chip and two external connections, wherein the external connections are fitted to a film.

SUMMARY OF THE INVENTION

One object of the invention is to provide an optoelectronic component which can be used as efficiently as possible.

This and other objects are attained in accordance with one aspect of the present invention directed to an optoelectronic component comprising at least one metal body and a layer sequence, which is applied on a base body and which is embodied to emit an electromagnetic radiation and to which an insulation is applied on at least one side area, wherein the at least one metal body is applied to at least one region of the insulation and is embodied in such a way that it is in thermally conductive contact with the base body.

While a current is applied to the optoelectronic component, such that an electromagnetic radiation is emitted, typically heat is always generated as well, which, particularly in the case of optoelectronic components in high-current applications, can lead to a lower luminous efficiency and a reduced operational period and even to destruction of the optoelectronic component. Furthermore, high heat generation can bring about a shift in wavelength of the emitted electromagnetic radiation and hence a fluctuation of the color locus.

The base body is provided for applying the layer sequences, which emit the electromagnetic radiation when the current is applied. One or a plurality of layer sequences can be arranged on the base body. The base body is typically embodied as a heat sink and is particularly suitable for dissipating the heat generated during the operation of the optoelectronic component, such that the respective optoelectronic component can be operated particularly efficiently. In order that the heat can be dissipated to the base body particularly well, the optoelectronic component comprises at least one metal body which is in thermally conducive contact with the base body. In order that no short circuit is produced by means of the metal body, an insulation is applied on at least one side area of the layer sequence, said insulation preferably being embodied in electrically insulating fashion and protecting the layer sequence against contamination for example during singulation of the optoelectronic components. The metal body can be assigned to one or a plurality of side areas of the optoelectronic component. As a result, depending on the requirement made with regard to the heat dissipation of the respective optoelectronic component, the heat can be dissipated in a particularly suitable manner and the optoelectronic component can be operated particularly efficiently.

In one advantageous embodiment, the insulation is embodied as an insulation layer or as an insulation layer sequence.

As a result, an electrical insulation between the metal body and the layer sequence can be ensured in a particularly reliable manner. Furthermore, reliable protection against contamination of the layer sequence can be ensured by means of the insulation layer or by means of the insulation layer sequence.

In a further advantageous embodiment, the insulation layer or the insulation layer sequence has a passivation layer and/or at least one air layer.

The insulation layer or insulation layer sequence embodied as a passivation layer is preferably embodied in electrically insulating fashion, such that no short circuit can be produced by means of the metal body. Furthermore, the passivation layer protects the layer sequence against contamination for example during singulation of the optoelectronic components.

The air layer can be arranged between the passivation layer and the layer sequence and/or between the passivation layer and the metal body, such that the metal body is electrically insulated from the layer sequence, such that short circuits can be reliably avoided.

In a further advantageous embodiment, the metal body is embodied as a metal mask.

Thereby, the metal mask is embodied in such a way that it has a cutout for the respective layer sequence of the optoelectronic component, such that the metal body embodied as a metal mask can encompass the layer sequence. Preferably, the metal mask is embodied as a ring-shaped metal body. In this way, it can be applied for example to the insulation of the respective side area of the layer sequence, said insulation being embodied as an insulation layer or insulation layer sequence, such that the heat generated in the layer sequence can be dissipated to the base body particularly well. Preferably, the metal mask can have a plurality of cutouts for an assemblage of layer sequences and can therefore be applied simultaneously to the assemblage of layer sequences, such that the respective optoelectronic components can be produced particularly cost-effectively.

In a further advantageous embodiment, the metal body is produced by means of an electrolytic method.

By means of the electrolytic method the metal body can be applied to the respective insulation of the layer sequence in a particularly suitable manner, such that the metal body is in thermally conductive contact with the base body. As a result, the heat generated by the operation of the optoelectronic component can be dissipated well and the optoelectronic component can therefore be operated particularly efficiently.

In a further advantageous embodiment, a current distribution structure is applied to at least one region of a surface of the layer sequence which is remote from the base body.

The current distribution structure typically constitutes an electrical coupling to the layer sequence of the optoelectronic component. The current distribution structure can be applied to that surface of the layer sequence which is remote from the base body by means of a photolithographic method and/or an electrolytic method, for example. In this case, the current distribution structure is applied over the respective surface of the layer sequence, thus e.g. in a square or rectangular structure, in such a way that a current supplied during the operation of the optoelectronic component can be introduced into the layer sequence particularly homogenously, such that the optoelectronic component can be operated particularly efficiently. A current distribution structure embodied in this way on that surface of the layer sequence which is remote from the base body is particularly suitable for large-area optoelectronic components for high-current applications.

In a further advantageous embodiment, the at least one metal body is in electrically conductive contact with the current distribution structure and with an electrical connection region for making electrical contact with the optoelectronic component.

By virtue of the further utilization of the metal body as an electrically conductive connection between the current distribution structure and the electrical connection region for making electrical contact with the optoelectronic component, the optoelectronic component can be produced particularly cost-effectively. In this case, the electrical connection region which is coupled to the current distribution structure on the surface of the layer sequence by means of the metal body constitutes a second electrical connection region of the optoelectronic component. A first electrical connection region is typically assigned to that surface of the layer sequence which faces the base area. In this case, the respective insulation is preferably embodied in such a way that it is arranged between the first and second electrical connection region in an electrically insulating fashion, such that a short circuit is avoided.

In a further advantageous embodiment, the base body is embodied as a ceramic body, as a passivated silicon body or as a passivated metallic body.

Such an embodiment of the base body is particularly suitable as a heat sink and thus for dissipating the heat generated during the operation of the optoelectronic component. The produced optoelectronic component comprising the base body embodied as a heat sink can be arranged, in preferred applications, in such a way that the base body is coupled to other bodies composed of suitable thermally conductive material, such that the optoelectronic component can be operated particularly efficiently. Typically, electrically conductive base bodies are coated by means of a passivation layer embodied in suitably thermally conductive fashion, to which the layer sequence and/or the electrical connection regions can be applied.

In a further advantageous embodiment, the at least one metal body comprises at least one of the constituents Au, Ag or Ni.

Such materials are suitable particularly for dissipating heat and simultaneously as an electrical conductor. Given suitable coupling of the metal body to the base body, the optoelectronic component can be produced particularly cost-effectively and operated particularly efficiently.

In a further advantageous embodiment, the at least one metal body is embodied as a reflector, for reflecting the electromagnetic radiation in a predefined emission direction.

The metal body can be embodied as a housing of the layer sequence in such a way that, by means of its edges, reflection of the emitted electromagnetic radiation in a predefined emission direction can be ensured. This embodiment of the metal body enables the emission characteristic of the optoelectronic component to be influenced in a particularly advantageous manner. An optoelectronic component embodied in this way is distinguished by cost-effective production and a high efficiency.

In a further advantageous embodiment, the optoelectronic component has a converter layer comprising at least one phosphor, said converter layer being applied on at least one region of that surface of the layer sequence which is remote from the base body, and being in thermally conductive contact with the at least one metal body.

The converter layer is typically embodied as a luminescence conversion layer comprising at least one phosphor. The phosphor can be excited by the electromagnetic radiation emitted by the optoelectronic component, which electromagnetic radiation can also be referred to as electromagnetic primary radiation, and emits a secondary radiation. In this case, the primary radiation and the secondary radiation have different wavelength ranges. A desired resultant color locus of the optoelectronic component can be set for example by setting a mixing ratio of the primary radiation and the secondary radiation. Typically, the converter layer comprises at least one material from the group consisting of silicones, siloxanes, spin-on oxides and photopatternable materials. The at least one phosphor is, for example, an organic phosphor and/or is present in part as nanoparticles.

The phosphors can be heated very greatly on account of the excitation by the primary radiation, particularly in the case of a UV primary radiation, and can thus heat the converter layer greatly. By virtue of the thermally conductive coupling of the metal body to such a converter layer, the heat generated in the converter layer can be dissipated particularly well to the base body embodied as a heat sink and the optoelectronic component can therefore be operated particularly efficiently. Furthermore a color locus fluctuation can be prevented and the emission characteristic of the optoelectronic component can therefore be influenced in a particularly advantageous manner.

BRIEF DESCRIPTION OF THE DRAWINGS

Exemplary embodiments of the invention are explained in greater detail below with reference to the schematic drawings, in which.

DETAILED DESCRIPTION OF THE DRAWINGS

In the exemplary embodiments and figures, identical or identically acting constituent parts are in each case provided with identical reference symbols. The constituent parts illustrated and also the size relationships of the constituent parts among one another should not be regarded as true to scale. Rather, some details of the figures are illustrated with an exaggerated size in order to afford a better understanding.

Figure 1:
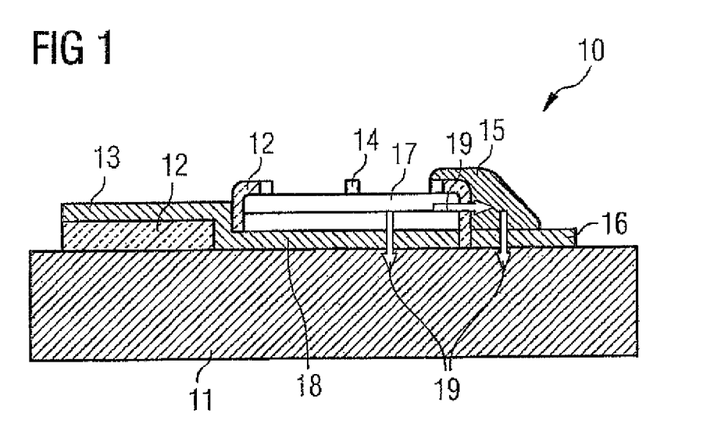
FIG. 1 shows a schematic sectional view of an optoelectronic component.

FIG. 1 illustrates an optoelectronic component 10, which is embodied as a luminescence diode for example. The optoelectronic component 10 comprises a base body 11, which is embodied for example as a ceramic body or as a passivated metallic body or as a passivated silicon body. The base body 11 is preferably embodied as a heat sink having a low heat conduction resistance and typically has a small thickness, thus e.g. 100 μm, as a result of which a small structural height of the optoelectronic component can be achieved. In particular, the base body is a film. The base body 11 serves as a carrier for a layer sequence 17, which is embodied to emit an electromagnetic radiation when an electric current is applied. The layer sequence 17 is embodied as a thin-film layer, for example.

The thin-film layer is based on nitride compound semiconductor materials, for example, and has at least one active region which is suitable for emitting the electromagnetic radiation. The electromagnetic radiation has wavelengths from the blue and/or ultraviolet spectrum, for example. In this case, the layer sequence 17 has typically been grown on a separate growth substrate, subsequently stripped away from the latter and applied to the base body 11. The stripping-away can be effected by means of a laser stripping method such as is known for example from WO 98/14986, the content of which in this regard is hereby incorporated. As an alternative, the stripping-away can be effected by means of etching or an otherwise suitable lift-off method.

Nitride compound semiconductor materials are compound semiconductor materials which contain nitrogen, such as materials from the system $In_xAl_yGa_{1-x-y}N$ where $0\leq x \leq 1$, $0\leq y \leq 1$ and $x+y \leq 1$. The thin-film layer has e.g. at least one semiconductor layer composed of a nitride compound semiconductor material.

The active region of the layer sequence 17 can contain for example a conventional pn junction, a double heterostructure, a single quantum well structure (SQW structure) or a multiple quantum well structure (MQW structure). Such structures are known to the person skilled in the art and will therefore not be explained in any greater detail at this juncture.

The layer sequence 17 has, at its side areas, an insulation 12 embodied as an insulation layer, which insulation is embodied as a passivation layer, for example, and comprises $SiO_2$, for example, as a constituent. Furthermore, the insulation 12 can be embodied as a resist layer applied to the layer sequence 17. The insulation 12 preferably has electrically insulating properties, that is to say a particularly high electrical resistance. The insulation 12 embodied as a passivation layer can be in contact directly with the side areas of the layer sequence 17. As an alternative, the layer sequence 17 can have, at its side areas, an insulation 12 embodied as an insulation layer sequence. This insulation can have, alongside the passivation layer, at least one further layer, thus e.g. an air layer and/or a resist layer, which is arranged for example between the side areas of the layer sequence 17 and the passivation layer.

A reflective electrical contact structure 18 is arranged between the layer sequence 17 and the base body 11, said contact structure being electrically coupled to a first electrical connection region 13. The electromagnetic radiation emitted by the layer sequence 17 is reflected at the reflective electrical contact structure 18. The first electrical connection region 13 is applied to the base body 11 on a further insulation layer 12, which is embodied as a passivation layer, for example. However, the first electrical connection region 13 can also be applied to the base body 11 without further insulation 12.

The layer sequence 17 is soldered or adhesively bonded onto the base body 11 by means of the reflective electrical contact structure 18, the base body 11 preferably being embodied in electrically insulating fashion, that is to say having a particularly high electrical resistance. As an alternative, however, the layer sequence 17 can also be applied to the base body 11 by means of an electrically insulating solder or a passivation layer between the reflective electrical contact structure 18 and said base body.

A current distribution structure 14 is applied on a surface of the layer sequence 17 which is remote from the base body 11. Said current distribution structure is typically formed in metallic fashion, thus e.g. composed of Au or Ag, on the surface of the layer sequence 17. The current distribution structure 14 typically runs in the form of contact webs over the surface of the layer sequence 17. Preferably, the contact webs form the contours of a plurality of rectangles or squares. Particularly preferably, the plurality of rectangles or squares each have at least one common side edge (not illustrated in FIG. 1) particularly preferably even two common side edges. In particular, the contact webs can form the contour of a plurality of squares and/or rectangles which each have a common corner point. The current distribution structure 14 is embodied, in the event of a current being applied, to introduce said current into the layer sequence 17 homogeneously in order to ensure as homogeneous current distribution as possible in the layer sequence 17. By means of such current distribution structures 14 it is possible to achieve a particularly homogeneous emission characteristic of the respective optoelectronic component 10, particularly if this is embodied in a particularly large-area fashion, thus e.g. greater than 1 $mm^2$.

Alongside the reflective electrical contact structure 18, a second electrical connection region 16 is applied on the base body 11, said second electrical connection region being electrically coupled to the current distribution structure 14 by means of a metal body 15. The metal body 15 is applied on at least one region of the insulation 12 of the layer sequence 17 and has a passivation layer, for example. As an alternative, however, the metal body 15 can also be applied to at least one region of an insulation 12 embodied as an insulation layer sequence, which insulation has for example a passivation layer and an air layer. The metal body 15 is applied to the second connection region 16 and/or the insulation 12 by means of an electrolytic method, for example. In principle, however, other methods known to a person skilled in the art can also be used for applying the metal body 15. In this case, the metal body 15 can be applied directly to at least one region of the insulation 12 embodied as a passivation layer. However, it is also possible for a further layer, thus e.g. an air layer, to be arranged at least in regions between the metal body 15 and the passivation layer. The metal body 15 typically contains constituents of Au, Ag, or Ni, and therefore advantageously has a low heat conduction resistance, and also a low electrical resistance. The metal body 15 is thermally conductively coupled to the base body 11 by means of the second connection region 16.

By way of example, the first and second electrical connection regions 13 and 16 are either printed on using a stencil or applied over the whole area and subsequently patterned in a desired manner by means of photolithography. Preferably, the first and second connection regions 13 and 16 are formed from a metal or a metal compound. In particular, the first and second connection regions 13 and 16 contain Au or Ag.

The heat generated during operation of the optoelectronic component 10 can be dissipated into the base body 11 perpendicularly to the layer sequence 17 and can additionally be dissipated into the base body 11 laterally with respect to the layer sequence 17 by means of the metal body 15 (see arrows 19). In this case, the metal body 15 can be embodied with a greater or lesser volume depending on the respective requirement with regard to the heat dissipation of the optoelectronic component 10. Particularly in the case of optoelectronic components 10 for high-current applications which have for example an edge length of 1 mm and require for example a current of 1 A for operation given a supply voltage of 3 V to 4 V, the metal body 15 has a particularly large volume and is coupled to the second connection region 16 over a large area in order that the heat generated is dissipated to the base body 11 particularly efficiently.

The reflective electrical contact structure 18 and the second electrical connection region 16 are electrically insulated from one another by means of the insulation 12, such that a short circuit between the two connection regions can be avoided.

In principle, the optoelectronic component 10 can also be embodied in such a way that the current distribution structure 14 is not coupled to the second electrical connection region 16 by means of the metal body 15. In such embodiments, the metal body 15 is typically used only for heat dissipation and can therefore also be applied directly to the base body 11, such that particularly high heat dissipation is ensured.

Figure 2A:
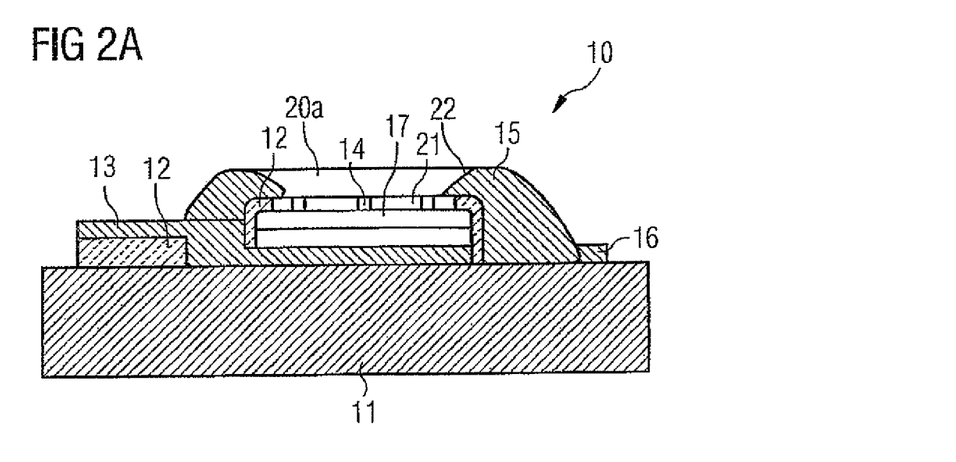
FIGS. 2A, 2B each show a further schematic sectional view of an optoelectronic component.

FIG. 2A illustrates a further exemplary embodiment of an optoelectronic component 10, comprising a metal body 15, which, embodied as a metal border, borders all four side areas of the layer sequence 17 (only the left and right side areas are illustrated in FIG. 2A), the metal body 15 not being electrically coupled to the current distribution structure 14 on that surface of the layer sequence 17 which is remote from the base body 11. As an alternative, the current distribution structure 14 can be electrically coupled to the second electrical connection region 16 by means of a bonding wire (not illustrated), the bonding wire being assigned for example to a corner point of at least one rectangle or square whose contour is formed by the contact webs. In particular, the bonding wire can be assigned to a common corner point of a plurality of squares and/or rectangles. By virtue of the metal body 15 making contact thermally conductively at a plurality of side areas of the layer sequence 17, the efficiency of the lateral heat dissipation into the base body 11 can additionally be increased, where attention should be drawn to the fact that the metal body 15 is not simultaneously electrically coupled to the first and second electrical connection regions 13 and 16.

The optoelectronic component 10 furthermore advantageously comprises a converter layer 20a embodied as a luminescence conversion layer, comprising at least one phosphor. Examples of a suitable phosphor include inorganic phosphors, the garnets doped with rare earths, in particular with Ce or Tb, which preferably have a basic structure $A_3B_5O_{12}$, or organic phosphors, such as perylene phosphors.

The converter layer 20a is coupled to that surface of the layer sequence 17 which is remote from the base body 11 by means of a transparent intermediate layer 21. The transparent intermediate layer is typically embodied as a passivation layer. The transparent intermediate layer 21 is preferably embodied in thermally conductive fashion, that is to say with a low heat conduction resistance, and is furthermore thermally conductively coupled to the metal body 15. Such an embodiment of the optoelectronic component 10 is particularly suitable for dissipating the generated heat in the layer sequence 17 and for dissipating to the base body 11 heat generated by the phosphor of the converter layer 20a, which is generated during the conversion of the primary radiation into the secondary radiation, particularly in the case of a primary radiation in the UV wavelength range.

In a further advantageous exemplary embodiment, the metal body 15 is embodied and shaped in such a way that it has a reflective effect at the metal body edges 22 assigned to the main emission direction of the emitted electromagnetic radiation of the layer sequence 17 and therefore advantageously influences the emission characteristic of the optoelectronic component 10.

The metal body 15 constitutes a housing of the optoelectronic component 10, to which additional optical elements and/or layers such as, for example, optical lenses and/or covering layers having beam-shaping properties can be applied.

Figure 2B:
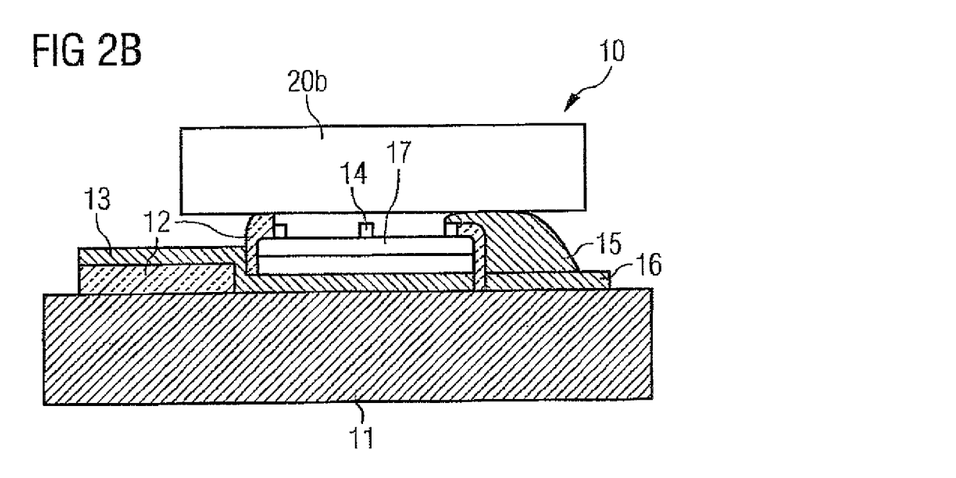

By way of example, in the exemplary embodiment illustrated in FIG. 2B, a converter ceramic 20b is applied on the metal body 15. A converter ceramic is, in particular, a base plate comprising as base material a ceramic, for example, in which a phosphor is introduced, which absorbs primary radiation having a first wavelength and converts it into secondary radiation having a further wavelength, which is different than the first wavelength. By way of example, inorganic phosphors mentioned above are suitable as the phosphor.

In the exemplary embodiment in FIG. 2B, the metal body 15 serves as a supporting carrier of the converter ceramic 20b. Furthermore, heat generated by the phosphor of the converter ceramic 20b, which is generated during the conversion of the primary radiation into the secondary radiation, particularly in the case of a primary radiation in the UV wavelength range, can advantageously be dissipated to the base body 11 by means of the metal body 15.

Air can be arranged between the converter ceramic 20b and the layer sequence 17. Air has a low thermal conductivity, such that it is possible to obtain a thermal insulation between the converter ceramic 20b and the layer sequence 17. As an alternative, in a manner corresponding to the exemplary embodiment in FIG. 2A the converter layer 20b can be connected to that surface of the layer sequence 17 which is remote from the base body 11 by means of a transparent intermediate layer.

For the rest, the exemplary embodiment in FIG. 2B corresponds to the exemplary embodiment in FIG. 1.

Figure 3:
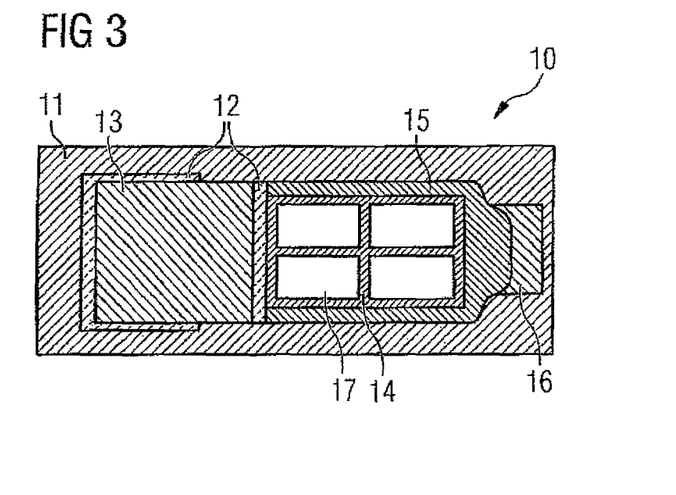
FIG. 3 shows a schematic plan view of an optoelectronic component.

FIG. 3 illustrates a plan view of an optoelectronic component 10. The first and second electrical connection regions 13 and 16 of the optoelectronic component 10 are applied on the base body 11. The first electrical connection region 13 is electrically coupled to the reflective electrical contact structure 18 (not illustrated). The second electrical connection region 16 is electrically coupled to the current distribution structure 14 by means of the metal body 15. The current distribution structure 14 is applied as a rectangular structure to that surface of the layer sequence 17 which is remote from the base body, thus e.g. by means of an electrolytic method. By means of the current distribution structure 14 arranged in rectangular fashion, the current can be fed to the layer sequence 17 particularly homogeneously in order to ensure a particularly homogeneous emission characteristic, in particular in the case of large-area optoelectronic components. As an alternative, however, the current distribution structure 14 can also be arranged in square fashion or in the form of concentric squares and/or rectangles with at least one common corner point.

The base body 15 encloses the layer sequence 17 at three side areas and thereby ensures a particularly good heat dissipation into the base body 11. A border of all four side areas of the layer sequence 17 is also possible.

Figure 4:
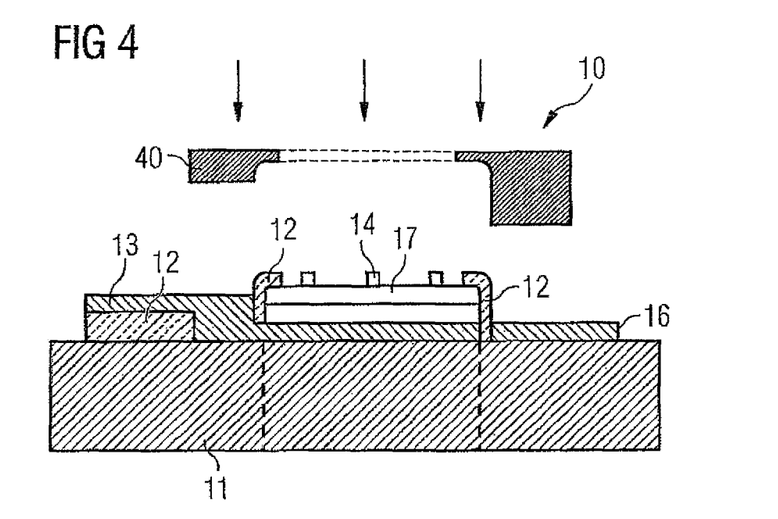
FIG. 4 shows a further schematic sectional view of an optoelectronic component with a metal mask.

FIG. 4 illustrates a further optoelectronic component 10, comprising the layer sequence 17 and a current distribution structure 14 applied thereon. FIG. 4 shows a further exemplary embodiment, wherein the metal body 15 is not applied galvanically but rather, embodied as a metal mask, is applied to the insulation 12 of the layer sequence 17. The metal body 15 embodied as a metal mask typically comprises a cutout in the shape of the layer sequence 17 and can be directly applied, e.g. soldered or adhesively bonded, onto the insulation 12 of the layer sequence 17. The metal body 15 embodied as a metal mask can be embodied in such a way that only in each case one side area of the layer sequence 17 is covered with the metal body 15. However, the metal mask can also be embodied in ring-shaped fashion, such that more than one side area is covered by means of the metal body 15. The application of the metal body 15 embodied as a metal mask is advantageous particularly when the metal mask has a plurality of cutouts in the shape of the layer sequence 17 and, consequently, an assemblage of layer sequences 17 of optoelectronic components 10 on, for example, a common base body 11 are provided with a metal body 15. Such production of optoelectronic components is particularly cost-effective.

In a further exemplary embodiment, the optoelectronic component 10 can be embodied in such a way that the first electrical connection region 13 is coupled to that surface of the layer sequence which is assigned to the base body 11 by means of a non-reflective electrical contact structure 18. Furthermore, the base body 11, in the region of the layer sequence 17 (dashed lines in FIG. 4) can be transparent, thus e.g. comprising glass, or be embodied with a cutout in the shape of the layer sequence 17, such that the optoelectronic component 10 emits the electromagnetic radiation in an emission direction facing away from the base body 11 and emits in an emission direction facing the base body 11. Such an embodiment of the optoelectronic component 10 also ensures that the heat is dissipated into the base body 11 laterally by means of the metal body 15.

Figure 5:
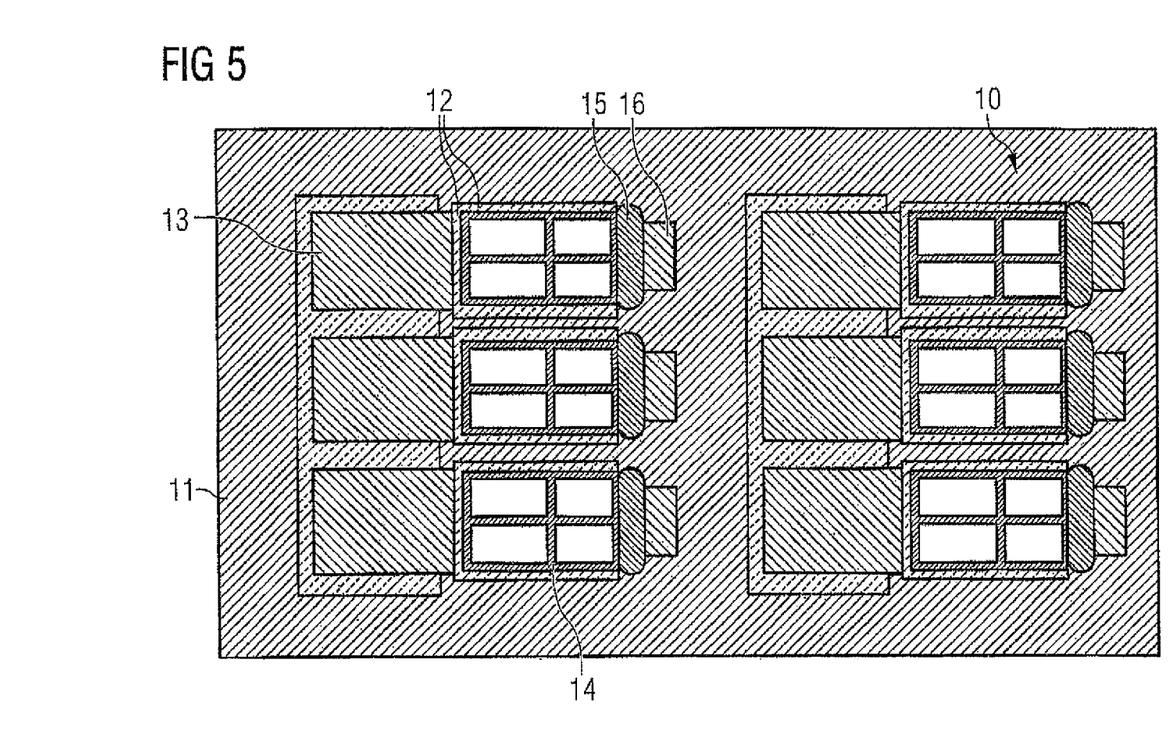
FIG. 5 shows a schematic illustration of an assemblage of a plurality of optoelectronic components.

FIG. 5 illustrates a plan view of an assemblage of a plurality of optoelectronic components 10 on a base body 11. Each of the optoelectronic components 10 illustrated comprises the first and second electrical connection regions 13 and 16. Depending on the requirement, the individual optoelectronic components 10 can be electrically interconnected, thus e.g. in a series circuit. The electrical contact-connection of the respective optoelectronic components 10 can be effected by means of a photolithographic method, for example. A metal body 15 which is embodied as a metal mask and which has a plurality of cutouts for all the layer sequences 17 of the assemblage of optoelectronic components 10 is also conceivable.

Each of the optoelectronic components 10 respectively comprises a metal body 15 on an insulation 12 embodied as an insulation layer or as an insulation layer sequence. By virtue of such an embodiment of the individual optoelectronic components 10, the required area of the respective optoelectronic component 10 is particularly small and, consequently, the component density on a predefined base body 11 can be embodied to be particularly high. In principle, however, the metal body 15 can also be embodied in ring-shaped fashion around the layer sequence 17.

The optoelectronic components 10 illustrated in FIG. 5 are embodied in rectangular fashion. However, other shapes of the optoelectronic components 10 are also conceivable, thus e.g. a hexagonal shape or a round shape. Particularly with regard to optimum heat dissipation and/or optimum utilization of the predefined area of the base body 11, it is necessary to decide which shape should most suitably be formed.

Furthermore, the assemblage of optoelectronic components 10 illustrated in FIG. 5 can be equipped with additional electronic components, thus e.g. capacitors, resistors and/or inductances. The additional electronic components can be arranged to form a predefined circuit arrangement for driving the optoelectronic components, thus e.g. for current limiting or brightness control.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An optoelectronic component comprising at least one metal body, a first electrical connection region, a second electrical connection region, an electrical contact structure and a layer sequence, on a base body and which is embodied to emit an electromagnetic radiation and to which an insulation is applied on at least one side area of the layer sequence,
    wherein the base body serves as a carrier for the layer sequence,
    wherein the layer sequence is suitable for emitting the electromagnetic radiation,
    wherein the electrical contact structure is arranged between the layer sequence and the base body, said electrical contact structure being electrically coupled to the first electrical connection region,
    wherein the at least one metal body is on at least one region of the insulation and is embodied in such a way that it is in thermally conductive contact with the base body,
    wherein a current distribution structure is on at least one region of a surface of the layer sequence which is remote from the base body,
    wherein the current distribution structure runs in the form of a contact web over the surface of the layer sequence,
    wherein the contact web forms contours of a plurality of rectangles or squares,
    wherein the second electrical connection region is applied on the base body, said second electrical connection region being electrically coupled to the current distribution structure,
    wherein the metal body is in electrically conductive contact with the current distribution structure and with the second electrical connection region for making electrical contact with the optoelectronic component, and
    wherein the optoelectronic component is free of a bonding wire.

2. The optoelectronic component of claim 1, wherein the insulation is embodied as an insulation layer or as an insulation layer sequence.

3. The optoelectronic component of claim 2, wherein the insulation layer or the insulation layer sequence has a passivation layer and/or at least one air layer.

4. The optoelectronic component of claim 1, wherein the at least one metal body is embodied as a metal mask.

5. The optoelectronic component of claim 1, wherein the at least one metal body is produced by means of an electrolytic method.

6. The optoelectronic component of claim 1, wherein the base body is embodied as a ceramic body, as a passivated silicon body or as a passivated metallic body.

7. The optoelectronic component of claim 1, wherein the at least one metal body comprises at least one of the constituents Au, Ag or Ni.

8. The optoelectronic component of claim 1, wherein the at least one metal body is embodied as a reflector for reflecting the electromagnetic radiation in a predefined emission direction.

9. The optoelectronic component of claim 1, further comprising a converter layer comprising at least one phosphor, said converter layer on at least one region of that surface of the layer sequence which is remote from the base body, and being in thermally conductive contact with the at least one metal body.

10. The optoelectronic component of claim 1, further comprising a converter ceramic comprising at least one phosphor, said converter ceramic on at least one region of that surface of the metal body which is remote from the base body, and being in thermally conductive contact with the at least one metal body.

11. The optoelectronic component of claim 1, wherein the current distribution structure and the metal body are directly attached to each other.

12. The optoelectronic component of claim 1, wherein the electrical contact structure and second electrical connection regions are embodied in a planar fashion.

13. The optoelectronic component of claim 1, wherein the insulation is embodied that it is further directly arranged between the electrical contact structure and the second electrical connection region in an electrical insulating fashion such that a short circuit is avoided.

14. The optoelectronic component of claim 1, wherein a layer of the layer sequence is embodied as a thin-film layer.

15. An optoelectronic component comprising at least one metal body, a first electrical connection region, a second electrical connection region, an electrical contact structure and a layer sequence on a base body and which is embodied to emit an electromagnetic radiation and to which an insulation is applied on a side area of the layer sequence,
- wherein the at least one metal body is on at least one side area of the insulation and is embodied in such a way that it is in thermally conductive contact with the base body,
- wherein the metal body is embodied as a ring-shaped metal body or a metal border from a top view in respect to the base body, which borders all side areas of the layer sequence,
- wherein the base body serves as a carrier for the layer sequence,
- wherein the layer sequence is suitable for emitting the electromagnetic radiation,
- wherein the electrical contact structure is arranged between the layer sequence and the base body, said electrical contact structure being electrically coupled to a first electrical connection region,
- wherein the second electrical connection region is applied on the base body,
- wherein the metal body is in electrically conductive contact with the current distribution structure and with an electrical connection region for making electrical contact with the optoelectronic component, and
- wherein the optoelectronic component is free of a bonding wire.

16. The optoelectronic component of claim 15, wherein the surface of the layer sequence comprises edge regions,
- wherein the insulation is additionally applied on at least one edge region of the surface of the layer sequence,
- wherein the metal body is in contact with the second electrical connection region or the base body,
- wherein the metal body is applied to the insulation, and
- wherein the metal body is applied to at least one edge region of the surface of the layer sequence which is facing away from the base body.

* * * * *